(12) United States Patent
Chen et al.

(10) Patent No.: US 8,482,314 B2
(45) Date of Patent: Jul. 9, 2013

(54) METHOD AND APPARATUS FOR IMPROVED MULTIPLEXING USING TRI-STATE INVERTER

(75) Inventors: Chun-Fu Chen, Chiayi (TW);
Hui-Zhong Zhuang, Kaohsiung (TW);
Jen-Hang Yang, Yonghe (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/291,204

(22) Filed: Nov. 8, 2011

(65) Prior Publication Data

US 2013/0113520 A1    May 9, 2013

(51) Int. Cl.
*H03K 19/00*    (2006.01)

(52) U.S. Cl.
USPC .................................. 326/58; 326/41; 326/47

(58) Field of Classification Search
USPC .......................................... 326/41, 47, 56–58
See application file for complete search history.

(56) References Cited

U.S. PATENT DOCUMENTS

| | | | | |
|---|---|---|---|---|
| 5,773,995 A * | 6/1998 | Crocker | | 326/108 |
| 5,955,912 A * | 9/1999 | Ko | | 327/410 |
| 6,557,066 B1 * | 4/2003 | Crafts et al. | | 710/305 |
| 6,803,793 B2 * | 10/2004 | Inoue | | 326/95 |
| 6,882,211 B2 * | 4/2005 | Kozaki | | 327/407 |
| 7,053,424 B2 * | 5/2006 | Ono | | 257/208 |
| 2002/0040985 A1 * | 4/2002 | Aldrich | | 257/202 |
| 2003/0046598 A1 * | 3/2003 | Crafts et al. | | 713/503 |
| 2008/0180289 A1 * | 7/2008 | Su et al. | | 341/120 |
| 2009/0167394 A1 * | 7/2009 | Bosshart | | 327/203 |
| 2010/0187633 A1 * | 7/2010 | Becker | | 257/369 |
| 2011/0032016 A1 * | 2/2011 | Maeno | | 327/203 |
| 2011/0084729 A1 * | 4/2011 | Yoko | | 326/56 |

OTHER PUBLICATIONS

Su, K.W. et al., "A Scaleable Model for STI Mechanical Stress Effect on Layout Dependence of MOS Electrical Characteristics", IEEE Custom Integrated Circuits Conference, 2003, pp. 245-248.

* cited by examiner

*Primary Examiner* — Jason M Crawford

(74) *Attorney, Agent, or Firm* — Duane Morris LLP

(57) ABSTRACT

A multiplexing circuit includes first and second tri-state inverters coupled to first and second data input nodes, respectively. The first and second tri-state inverters include first and second stacks of transistors, respectively, coupled between power supply and ground nodes. Each stack includes first and second PMOS transistors and first and second NMOS transistors. The first and second stacks include first and second dummy transistors, respectively.

17 Claims, 6 Drawing Sheets

METHOD AND APPARATUS FOR IMPROVED MULTIPLEXING USING TRI-STATE INVERTER

BACKGROUND

Multiplexers are commonly used to select one of several input signals for provision at an output line. The logic function corresponding to 2:1 multiplexing may be expressed as OUT=A*S+B*SBAR, where A and B are data inputs, S and SBAR are a select input and its complement, OUT is the output of the multiplexer, and "*" and "+" represent logical "AND" and logical "OR," respectively. A known implementation of a 2:1 multiplexer includes a pair of tri-state inverters. Each tri-state inverter is coupled to one of the data inputs and includes four metal oxide semiconductor (MOS) transistors, including two NMOS transistors and two PMOS transistors. For each tri-state inverter, if one of the PMOS transistors and one of the NMOS transistors are controlled to be in an open ("off") state, an output of that tri-state inverter is set to be electrically floating (high impedance), and if those transistors are controlled to be in a closed ("on") state, the output of that tri-state inverter is the logical complement of the corresponding data input. The two tri-state inverters share a common output node, which is possible due to tri-state logic (one of the tri-state inverters disconnects its output). An inverter having that common output node as an input provides the overall multiplexer output. Another inverter inverts a data select input for provision to the tri-state inverters.

BRIEF DESCRIPTION OF THE DRAWINGS

The following will be apparent from elements of the figures, which are provided for illustrative purposes and are not necessarily to scale.

DETAILED DESCRIPTION

Figure 1:
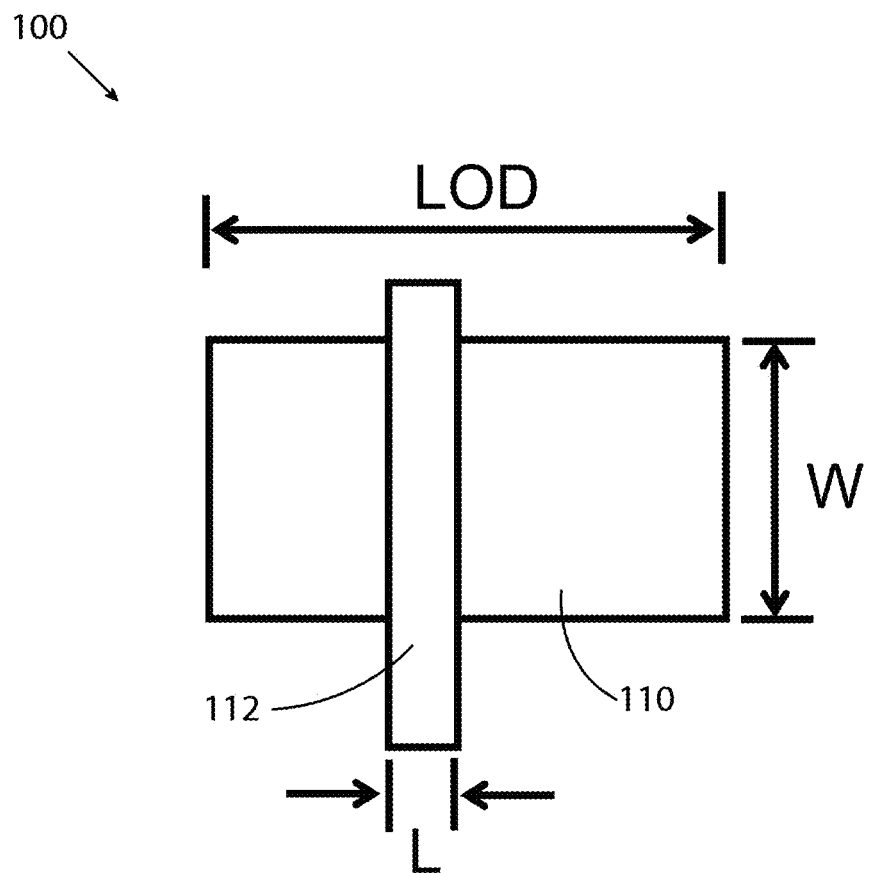
FIG. 1 is layout plan (top) view showing geometry pertinent to the LOD effect.

This description of certain exemplary embodiments is intended to be read in connection with the accompanying drawings, which are to be considered part of the entire written description. In the description, relative terms such as "lower," "upper," "horizontal," "vertical," "left," "right," "above," "below," "up," "down," "top" and "bottom" as well as derivative thereof (e.g., "horizontally," "vertically," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled", "connected" and "interconnected," refer to a relationship wherein structures communicate with one another either directly or indirectly through intervening structures unless expressly described otherwise.

An OD ("oxide definition" or "oxide diffusion") region defines an active area for one or more transistors, i.e., an area where the source, drain and channel under the gate of transistor(s) are defined. The active area is defined between trench isolation or field oxide inactive areas. In the known 2:1 multiplexer described above, the eight MOS transistors (four PMOS and four NMOS) that form the pair of tri-state inverters may be implemented using a circuit layout in which OD regions, are associated with various ones of those eight transistors. For example, a first OD region may correspond to one of the PMOS transistors, and a second OD region may correspond to the other three PMOS transistors. Similarly, a third OD region may correspond to one of the NMOS transistors, and a fourth OD region may correspond to the other three NMOS transistors. A discontinuity (gap) separates the first and second OD regions, and another discontinuity separates the third and fourth OD regions. Such discontinuities in the OD regions cause device performance degradation.

Such performance degradation is due to a phenomenon referred to as the "Length of thin Oxide Definition region effect" or "LOD effect." The LOD effect is described in "A Scaleable Model for STI Mechanical Stress Effect on Layout Dependence of MOS Electrical Characteristics," by K.-W. Su et al, IEEE 2003 Custom Integrated Circuits Conference. FIG. 1 is layout plan (top) view showing geometry pertinent to the LOD effect. An OD region 110 and a polysilicon (poly) line 112 having a dimension L are shown for a layout cell 100. Similar layout cells may be arranged on either side in repeating fashion (not shown) and may be used to implement various types of devices. The length parameter LOD (length of OD) and a width W are also shown in FIG. 1. According to the LOD effect, in MOS devices, stress distribution along the channel of the devices may be induced by the trench isolations, e.g., by edges between shallow trench isolation (STI) and OD regions. Such stresses that are associated with circuit layout characteristics may influence device behaviors. When the OD size (LOD, or length of OD) decreases, stress at an edge between STI and OD regions may increase, which may negatively impact mobility of charge carriers. Such stress may impact doping profiles, may impact drain current in the linear mode ($Id_{lin}$) or drain current in the saturation mode ($Id_{sat}$) by about 5% to 35%, may impact threshold voltage ($V_{th}$) by about 60 mV to 100 mV, and may impact cutoff current (Ioff) by a factor of two or more.

In various embodiments discussed herein the underlying cause of the LOD effect (e.g. decreased length of OD region, or decreased LOD) is remedied, with the resulting devices exhibiting improved device performance, including stronger device current in saturation.

Figure 2:
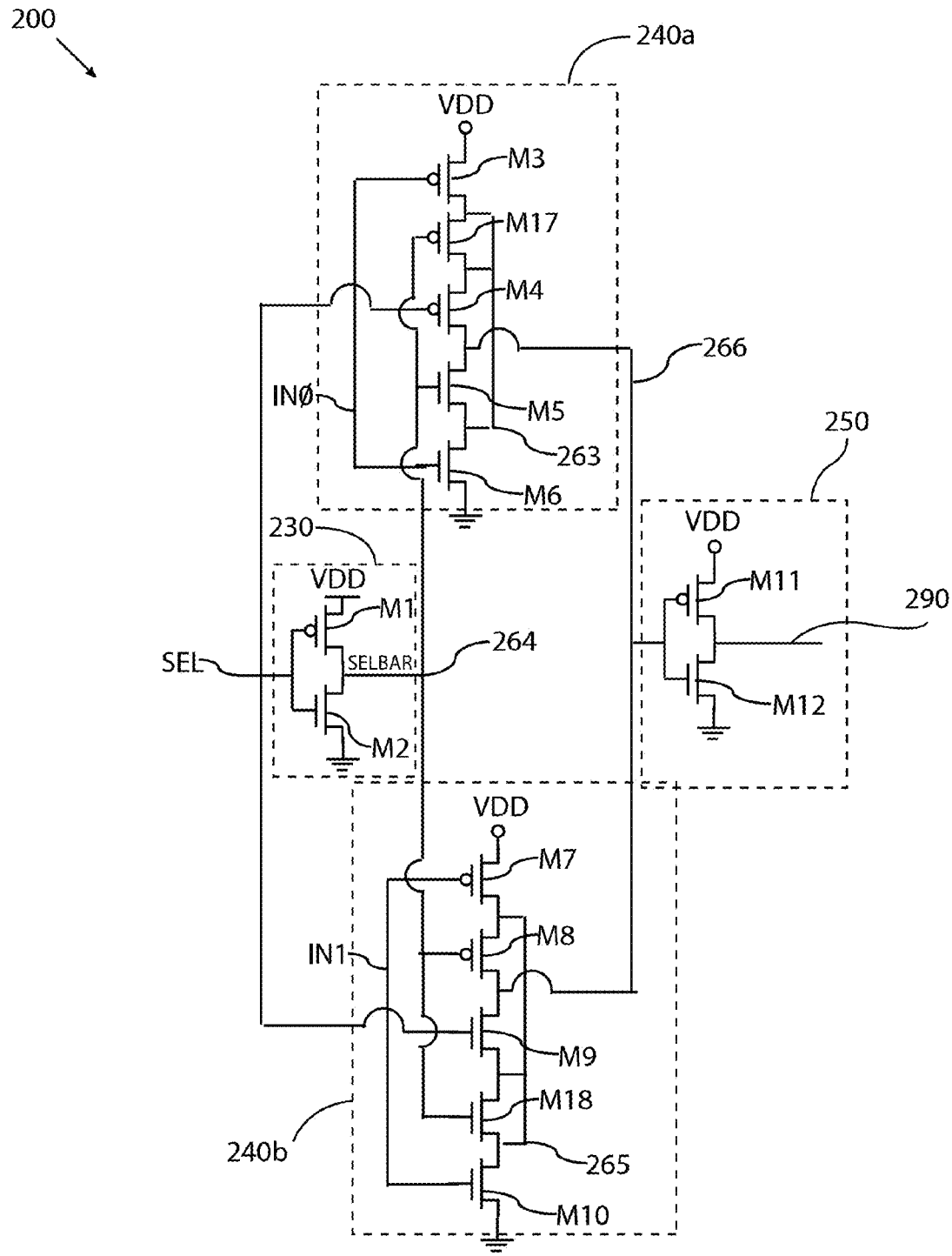
FIG. 2 is a schematic diagram of a 2:1 multiplexer in accordance with an embodiment of the present disclosure, with a built-in mechanism to bias gates of dummy metal oxide semiconductor (MOS) transistors.

FIG. 2 is a schematic diagram of a 2:1 multiplexer in accordance with an embodiment. Multiplexer 200 receives data input signals IN0 and IN1 and, depending on a select input signal SEL, provides either IN0 or IN1 as a multiplexed output signal 290. A CMOS inverter 230 including a PMOS transistor M1 and an NMOS transistor M2 inverts SEL to provide a complementary select signal SELBAR at node 264. IN0, IN1, SEL, and SELBAR are provided as inputs to tri-state inverters 240a and 240b.

Tri-state inverter 240a includes PMOS transistors M3, M17, and M4 and NMOS transistors M5 and M6. Transistor M3 has a source coupled to a positive power supply voltage (e.g., $V_{DD}$) and a gate coupled to IN0. Transistor M17 is a "dummy" PMOS transistor. Whereas ordinarily a transistor may be used to control current flow between two nodes (e.g., that are coupled to source and drain terminals) based on a gate voltage, a gate of a dummy transistor such as M17 does not have such a controlling effect on current flow in the circuit. For example, M17 may have source and drain terminals coupled to each other by node 263, to conduct current between those terminals regardless of whether the gate of that transistor is logically high or low (i.e., the short between the source and drain terminals bypasses the transistor channel). The source and drain terminals of transistor M17 are coupled to a drain of transistor M3. The gate of transistor M17 is coupled to the gate of transistor M5 and to node 264 that provides SELBAR. Transistors M4 and M5 have gates coupled to SEL and SELBAR, respectively. Transistor M6 has a source coupled to a ground node (e.g., $V_{SS}$) and a gate coupled to IN0. Transistor M5 has a source coupled to a drain of transistor M6. When SEL is a logical high voltage value (e.g., '1') and SELBAR is a logical low voltage value (e.g., '0'), transistors M4 and M5 are off (not conducting between source and drain terminals), thereby rendering node 266 electrically floating. When SEL=0 and SELBAR=1, transistors M4 and M5 are on, and because dummy transistor M17 has its source and drain terminals coupled together, node 266 has the complementary (inverted) logic value as IN0 due to transistors M3 and M6. In this case, with SEL=0 and SELBAR=1, the gate of transistor M17 is biased by SELBAR at node 264, avoiding a floating gate. Biasing the gate of transistor M17 to logic '1' to turn off that transistor may reduce leakage. With transistor M17 turned off in that case, transistors M3, M4, M5, and M6 provide the functionality of a CMOS tri-state inverter.

In an analogous manner, tri-state inverter 240b selectively provides a logical complement of IN1 at node 266 or renders node 266 electrically floating. Tri-state inverter 240b includes PMOS transistors M7 and M8 and NMOS transistors M9, M18, and M10. Transistor M18, like transistor M17, is a dummy transistor that has its source and drain terminals coupled together by node 265, to conduct current between those terminals regardless of whether the gate of that transistor is logically high or low. When SEL=0 and SELBAR=1, transistors M8 and M9 are off, thereby rendering node 266 floating. When SEL=1 and SELBAR=0, transistors M8 and M9 are on, and node 266 has the complementary logic value as IN1 due to transistors M7 and M10.

Thus, by employing tri-state logic, tri-state inverters 240a and 240b that are controlled by SEL and SELBAR provide an inversion of one of the input signals IN0, IN1 at node 266, which is provided as an input to another CMOS inverter 250 including transistors M11 and M12. Signal 290 is thus set equal to either IN0 and IN1, effecting the 2:1 multiplexing functionality of multiplexer 200.

Figure 3:
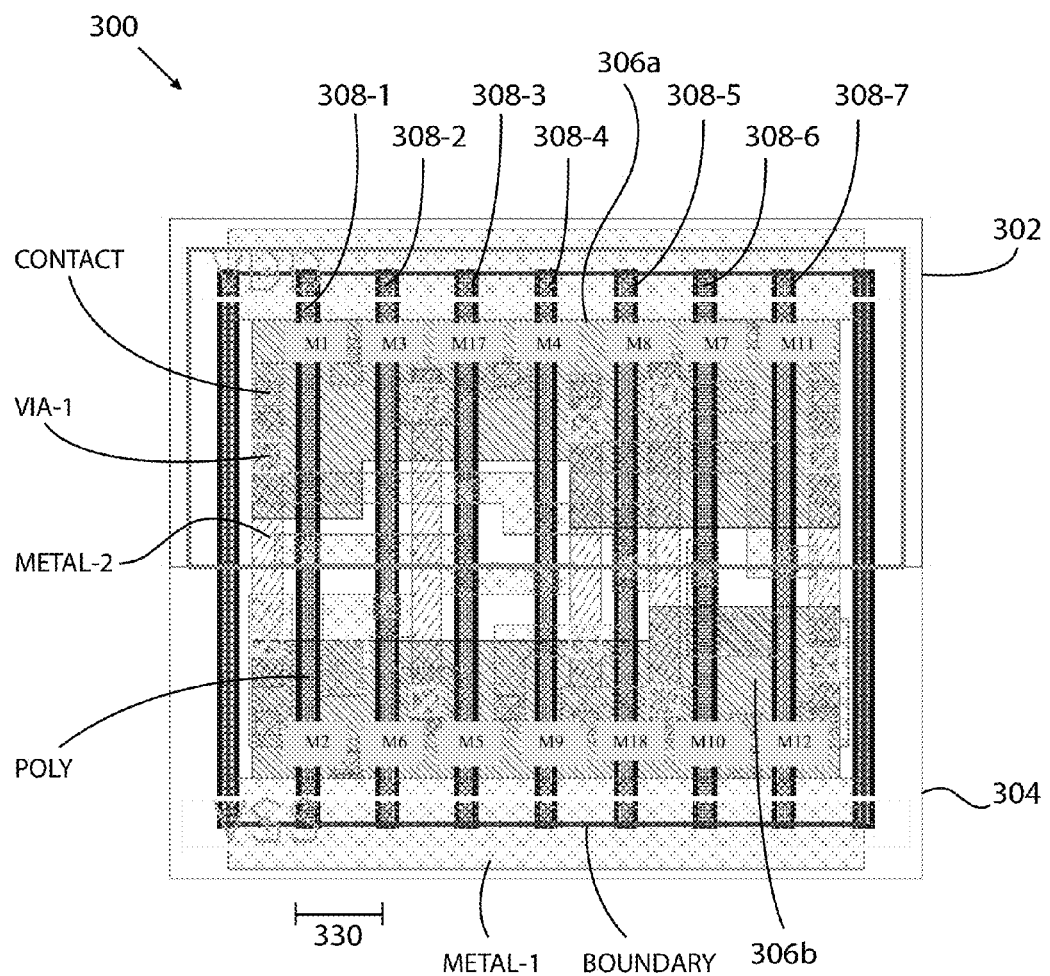
FIG. 3 is a plan (top) view of a layout implementing the circuit shown in FIG. 2.

FIG. 3 is a plan (top) view of a layout implementing the multiplexer circuit 200 shown in FIG. 2. The top half of layout 300 corresponds to a P implant region 302, and the bottom half corresponds to an N implant region 304. PMOS and NMOS transistors are provided in the P implant and N implant regions, respectively. OD regions 306a and 306b are active areas in the layout of the integrated circuit. Polysilicon (poly) lines 308-1, 308-2, 308-3, 308-4, 308-5, 308-6, and 308-7 (collectively, poly lines 308) are formed above OD regions 306a and 306b during the layout process, e.g., using photolithography and/or etching. Poly lines 308 connect OD regions 306a and 306b. In the plan view of FIG. 3, poly lines 308 are shown with a vertical orientation and define a common poly pitch 330. The pitch of regularly spaced poly lines 308 is the distance from a first side of a given line (e.g., left side of poly line 308-1 in the orientation of FIG. 3) to the first side of an adjacent line (e.g., left side of poly line 308-2). Poly lines 308 form the gates of PMOS transistors M1, M3, M17, M4, M8, M7, and M11, and of NMOS transistors M2, M6, M5, M9, M18, M10, and M12, as shown in FIG. 3. OD regions 306a and 306b and poly lines 308 form the MOS transistors of multiplexer 200.

As shown in FIG. 3, OD region 306a extends continuously in a horizontal direction to span poly lines 308. Similarly, OD region 306b extends continuously to span poly lines 308. Layout 300 having such continuous OD regions provides advantages in terms of device performance. In a 2:1 multiplexer that does not use dummy transistors M17 and M18, discontinuities in the PMOS and NMOS OD regions are present at the locations corresponding to transistors M17 and M18, respectively, of FIG. 3, because in such a multiplexer, there are no transistors to occupy those locations in the layout. In other words, inclusion of dummy transistors M17 and M18 in embodiments of the present disclosure eliminate OD region discontinuities that may otherwise be present. With the discontinuities eliminated (i.e., with continuous OD regions that extend horizontally across poly lines 308), the length of the OD regions is effectively increased relative to prior approaches of 2:1 multiplexing, thereby reducing stresses associated with the LOD effect. As a result, in various embodiments device performance is improved, e.g., with increased drain saturation current $Id_{sat}$.

Figure 4:
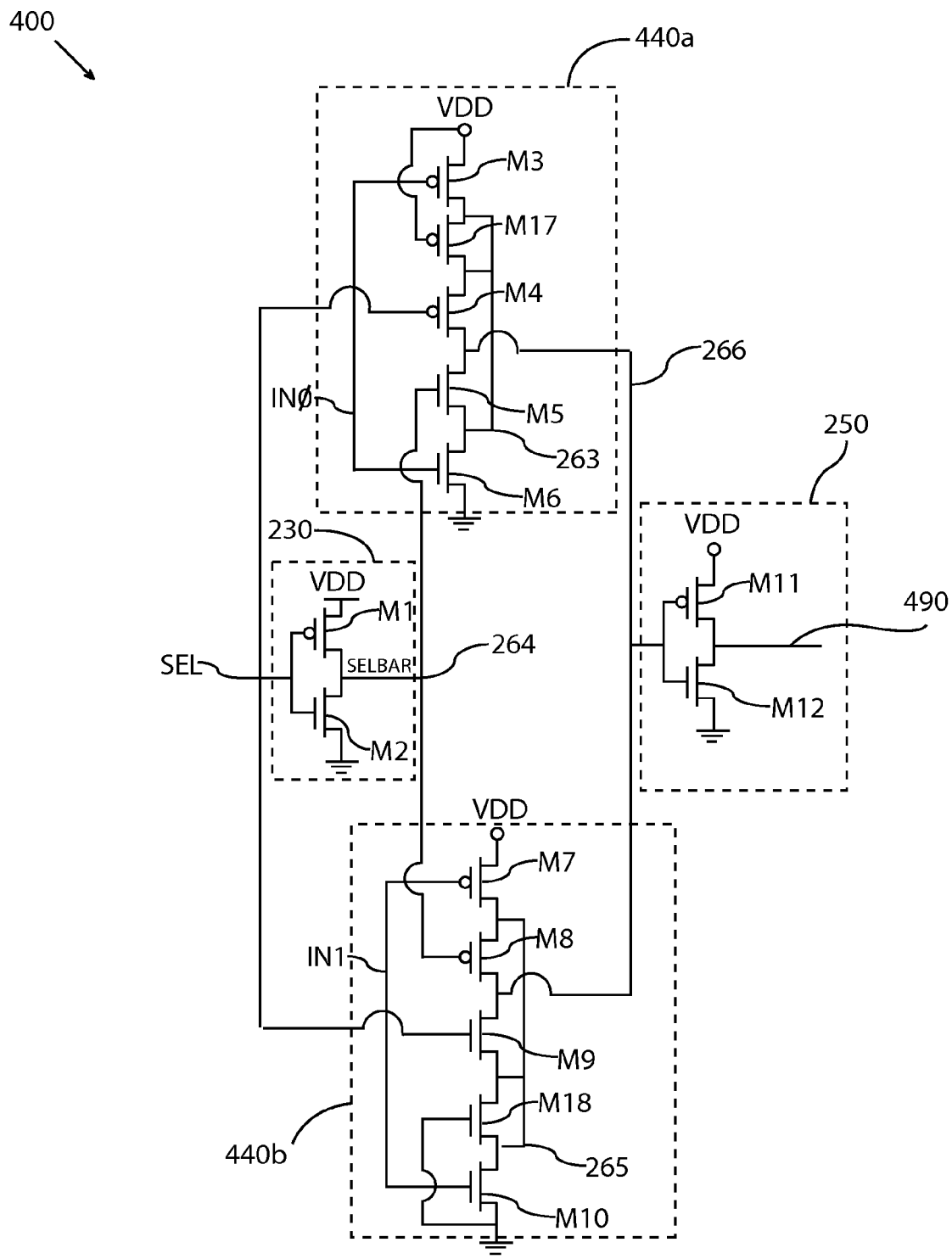
FIG. 4 is a schematic diagram of a 2:1 multiplexer in accordance with another embodiment, with dummy MOS transistors having gates tied to ground or to a power supply voltage.

FIG. 4 is a schematic diagram of a 2:1 multiplexer in accordance with another embodiment. Multiplexer circuit 400 provides the same multiplexing functionality as multiplexer 200 in terms of selecting either IN0 or IN1 to be provided at an output signal 490 based on a select input signal SEL. Multiplexer 400 includes CMOS inverters 230 and 250 that are configured similarly as in FIG. 2. Tri-state inverters 440a and 440b include the same transistors as in FIG. 2, including dummy transistors M17 and M18, but with different gate configurations for the dummy transistors. The gate of PMOS transistor M17 is tied high (tied to $V_{DD}$) in circuit 400, which would ordinarily turn that transistor off if not for node 263 coupling the source and drain terminals of the transistor. Similarly, the gate of NMOS transistor M18 is tied low (tied to $V_{SS}$) in circuit 400, which would ordinarily turn that transistor off if not for node 253 coupling the source and drain terminals of the transistor.

Figure 5:
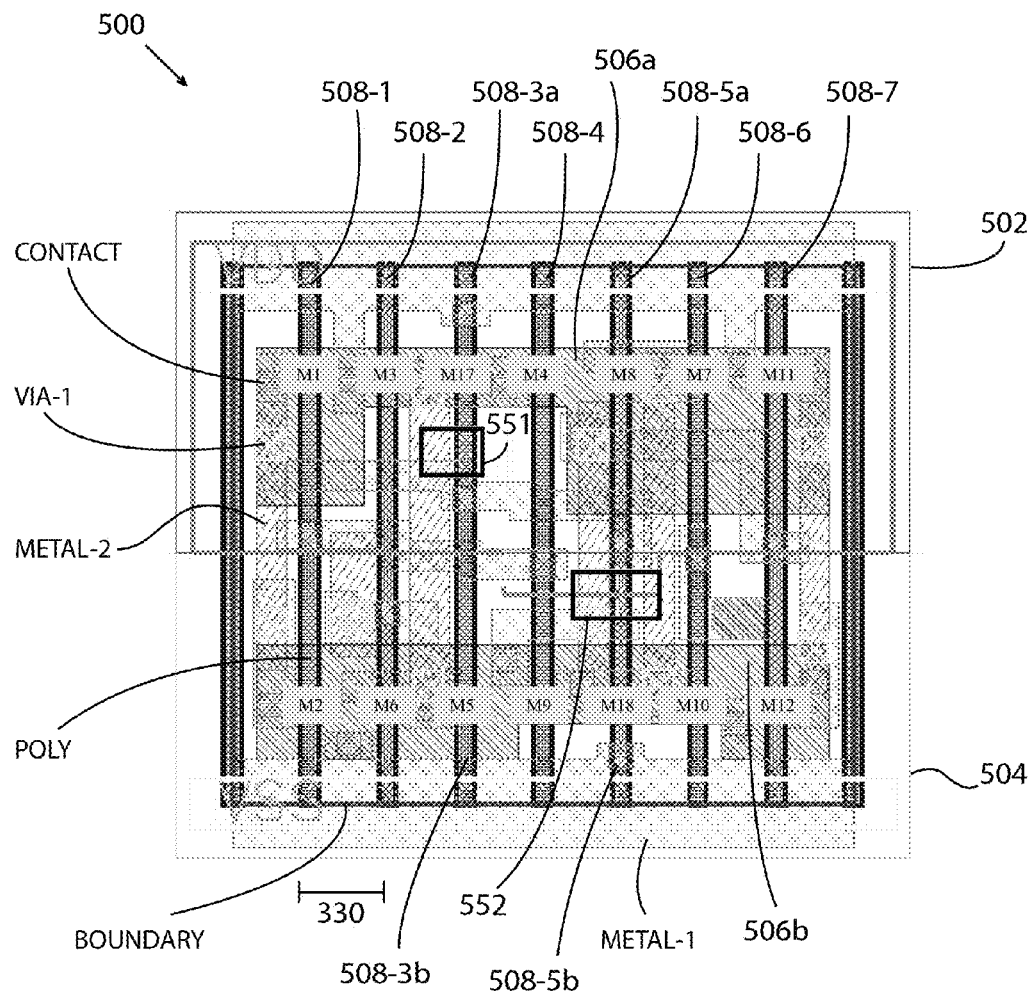
FIG. 5 is a plan (top) view of a layout implementing the circuit shown in FIG. 4.

FIG. 5 is a plan (top) view of a layout implementing the multiplexer circuit 400 shown in FIG. 4. The top half of layout 500 corresponds to a P implant region 502, and the bottom half corresponds to an N implant region 504. PMOS and NMOS transistors are provided in the P implant and N implant regions, respectively. OD regions 506a and 506b form active areas in the layout of the integrated circuit. Poly lines 508-1, 508-2, 508-3a, 308-3b, 508-4, 508-5a, 508-5b, 508-6, and 508-7 (collectively, poly lines 508) are formed above OD regions 506a and 506b as shown. Poly lines 508 form the gates of PMOS transistors M1, M3, M17, M4, M8, M7, and M11, and of NMOS transistors M2, M6, M5, M9, M18, M10, and M12, as shown in FIG. 5. A "cut poly off" (CPO) layer may be formed at location 551, and another CPO layer may be formed at location 552. These CPO layers may be masks that may be etched, according to processes known by one of ordinary skill in the art, to disconnect (cut off) poly lines 508-3a and 508-3b from one another, and to disconnect poly lines 508-5a and 508-5b from one another. Thus, in this example transistors M17 and M5 have different gates, and transistors M8 and M18 have different gates, as shown in FIG. 4. In the plan view of FIG. 5, poly lines 508 are shown with a vertical orientation and define poly pitch 330. OD regions 506a and 506b and poly lines 508 form the MOS transistors of multiplexer 400.

As shown in FIG. 5, and similar to FIG. 3, OD region 506a extends continuously in a horizontal direction to span poly lines 508. Similarly, OD region 506b extends continuously to span poly lines 508. Similar to layout 300, the continuous OD regions of layout 500 provide advantages in terms of device performance. Thus, layouts 300 and 500 corresponding to FIGS. 3 and 5, respectively, constitute different layouts that each address the LOD effect issue that degrades performance of multiplexers.

Embodiments of the present disclosure provide various advantages in addition to those described above. The delay of a multiplexer cell may be reduced, and a multiplexer cell may operate faster than conventional 2:1 multiplexer cells. The shape of the OD regions is similar to the shape of OD regions in other multiplexer approaches apart from the elimination of discontinuities described above, and no area penalty is incurred relative to conventional approaches.

Figure 6:
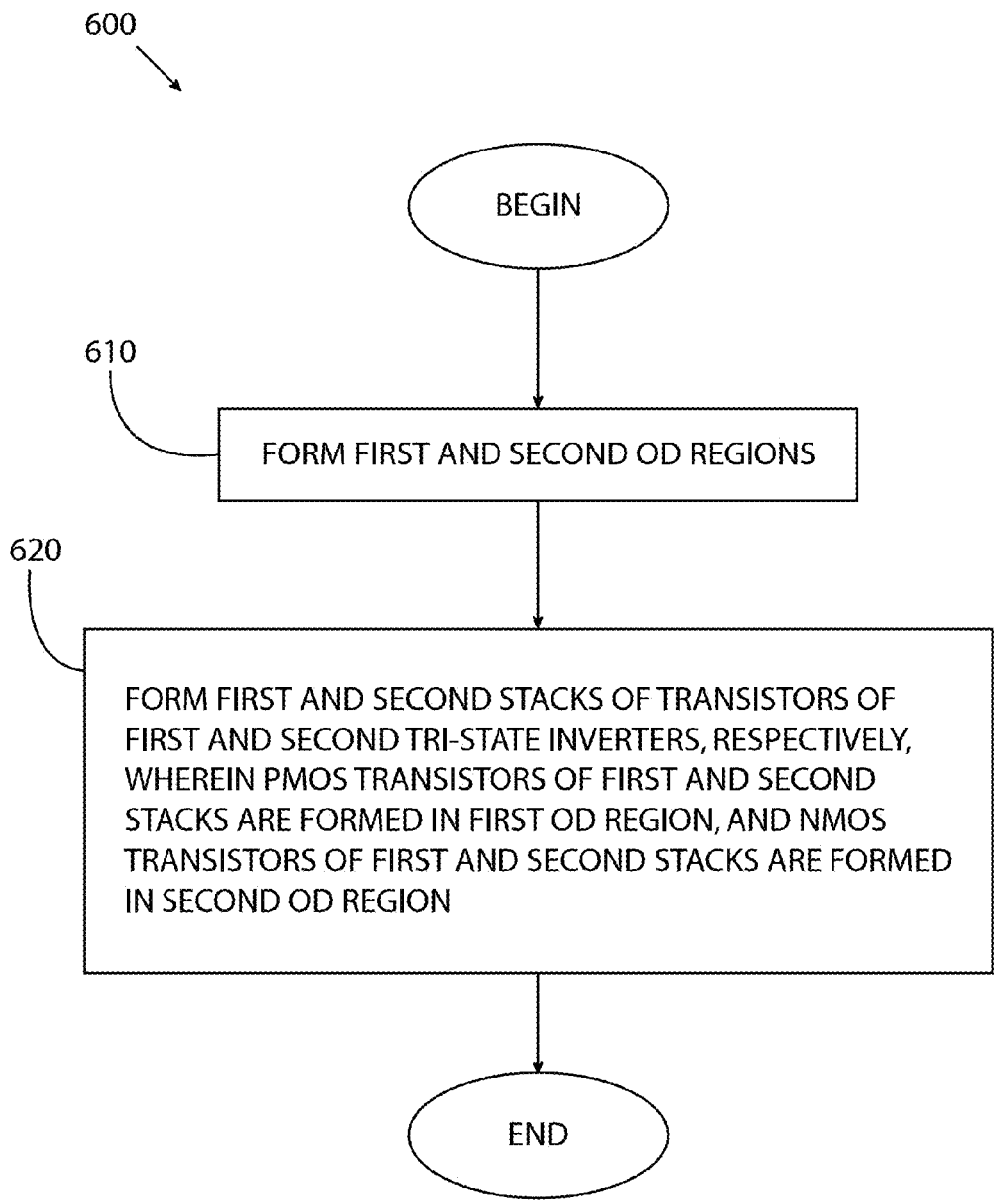
FIG. 6 is a flow diagram of a process in accordance with some embodiments.

FIG. 6 is a flow diagram of a process for making a multiplexer, in accordance with some embodiments. After process 600 begins, a first oxide definition (OD) region and a second OD region are formed (610). The first and second OD regions define corresponding active areas in a layout of an integrated circuit. First and second stacks of transistors of first and second tri-state inverters, respectively, are formed (620). The first and second stacks are coupled between power supply and ground nodes. Each stack includes first and second PMOS transistors and first and second NMOS transistors. The PMOS transistors of the first and second stacks are formed in the first OD region, and the NMOS transistors of the first and second stacks are formed in the second OD region.

In some embodiments, a multiplexing circuit includes first and second tri-state inverters (e.g., inverters 240a and 240b, or inverters 440a and 440b) coupled to first and second data input nodes (e.g., IN0 and IN1), respectively. The first and second tri-state inverters include first and second stacks of transistors, respectively, coupled between power supply (e.g., VDD) and ground (e.g., VSS) nodes. Each stack includes first and second PMOS transistors (e.g., transistors M3 and M4 for a first stack as in inverter 240a or inverter 440a, or transistors M7 and M8 for a second stack as in inverter 240b or inverter 440b) and first and second NMOS transistors (e.g., transistors M6 and M5 for a first stack as in inverter 240a or inverter 440a, or transistors M10 and M9 for a second stack as in inverter 240b or inverter 440b). The first and second stacks include first and second dummy transistors (e.g., transistors M17 and M18), respectively.

In some embodiments, an integrated circuit includes a first oxide definition (OD) region and a second OD region. The first and second OD regions define corresponding active layers in a layout of the integrated circuit. The integrated circuit includes first and second tri-state inverters that include first and second stacks of transistors, respectively, coupled between power supply and ground nodes. Each stack includes first and second PMOS transistors and first and second NMOS transistors. The PMOS transistors of the first and second stacks are formed in the first OD region, and the NMOS transistors of the first and second stacks are formed in the second OD region.

In some embodiments, a first oxide definition (OD) region and a second OD region are formed. The first and second OD regions define corresponding active areas in a layout of an integrated circuit. First and second stacks of transistors of first and second tri-state inverters, respectively, are formed. The first and second stacks are coupled between power supply and ground nodes. Each stack includes first and second PMOS transistors and first and second NMOS transistors. The PMOS transistors of the first and second stacks are formed in the first OD region, and the NMOS transistors of the first and second stacks are formed in the second OD region.

Although examples are illustrated and described herein, embodiments are nevertheless not limited to the details shown, since various modifications and structural changes may be made therein by those of ordinary skill within the scope and range of equivalents of the claims.

What is claimed is:

1. A multiplexing circuit comprising:
   first and second tri-state inverters coupled to first and second data input nodes, respectively, the first and second tri-state inverters including first and second stacks of transistors, respectively, coupled between power supply and ground nodes, each stack including first and second PMOS transistors and first and second NMOS transistors,
   wherein the first and second stacks further include first and second dummy transistors, respectively.

2. The multiplexing circuit of claim 1, wherein a source terminal and a drain terminal of each dummy transistor are tied to one another.

3. The multiplexing circuit of claim 1, wherein:
   the first NMOS and PMOS transistors of the first stack have gate terminals coupled to the first data input node;
   the first NMOS and PMOS transistors of the second stack have gate terminals coupled to the second data input node;
   the second PMOS and NMOS transistors of the first stack have gate terminals coupled to a select signal node and a select signal complement node, respectively; and
   the second NMOS and PMOS transistors of the second stack have gate terminals coupled to the select signal and select signal complement nodes, respectively.

4. The multiplexing circuit of claim 3, further comprising a CMOS inverter including an input and an output coupled to the select signal and select signal complement nodes, respectively.

5. The multiplexing circuit of claim 3, wherein the first dummy transistor is a PMOS transistor and the second dummy transistor is a NMOS transistor.

6. The multiplexing circuit of claim 3, wherein a gate of the first dummy transistor is coupled to a gate of the second dummy transistor.

7. The multiplexing circuit of claim 6, wherein the gates of the dummy transistors are coupled to the select signal complement node.

8. The multiplexing circuit of claim 3, wherein the gates of the first and second dummy transistors are coupled to the power supply and ground nodes, respectively.

9. The multiplexing circuit of claim 1, wherein the first dummy transistor is coupled between the first and second PMOS transistors of the first tri-state inverter, and the second dummy transistor is coupled between the first and second NMOS transistors of the second tri-state inverter.

10. The multiplexing circuit of claim 1, wherein the gate of the first dummy transistor is coupled to the gate of the second NMOS transistor of the first stack of transistors, and the gate of the second dummy transistor is coupled to the gate of the second PMOS transistor of the second stack of transistors.

11. The multiplexing circuit of claim 1, wherein the gates of the first and second dummy transistors are coupled to the power supply and ground nodes, respectively.

12. A multiplexing integrated circuit comprising:
a first oxide definition (OD) region and a second OD region, said first and second OD regions defining corresponding active areas in a layout of the integrated circuit;
first and second tri-state inverters including first and second stacks of transistors, respectively, coupled between power supply and ground nodes, each stack including first and second PMOS transistors and first and second NMOS transistors;
first, second, third, fourth, and fifth poly lines oriented in a first direction and defining a common poly pitch; and
a sixth poly line adjacent to said first poly line;
wherein the PMOS transistors of the first and second stacks are formed in the first OD region, and the NMOS transistors of the first and second stacks are formed in the second OD region;
wherein each OD region extends continuously at least five poly pitches in a second direction perpendicular to the first direction, said second poly line is adjacent to said first poly line, said third poly line is adjacent to said second poly line, said fourth poly line is adjacent to said third poly line, and said fifth poly line is adjacent to said fourth poly line; and
wherein said first and second OD regions and said sixth poly line form a CMOS inverter having an input node and an output node, and the input and output nodes of said CMOS inverter are each coupled to a gate of at least one transistor in each stack, and each OD region extends continuously along the second direction at least from said first poly line to said sixth poly line.

13. The integrated circuit of claim 12, wherein the first and second stacks include first and second dummy transistors, respectively, formed in the first and second OD regions, respectively.

14. The multiplexing circuit of claim 13, wherein the first dummy transistor is a PMOS transistor and the second dummy transistor is an NMOS transistor.

15. The multiplexing circuit of claim 13, wherein a gate of the first dummy transistor is coupled to a gate of the second dummy transistor.

16. The multiplexing circuit of claim 13, wherein the gates of the first and second dummy transistors are coupled to the power supply and ground nodes, respectively.

17. A method of making a multiplexer, the method comprising:
forming a first oxide definition (OD) region and a second OD region, said first and second OD regions defining corresponding active areas in a layout of an integrated circuit; and
forming first and second stacks of transistors of first and second tri-state inverters, respectively, the first and second stacks coupled between power supply and ground nodes, each stack including first and second PMOS transistors and first and second NMOS transistors;
wherein a first dummy transistor of the first stack is formed in the first OD region, and a second dummy transistor of the second stack is formed in the second OD region;
wherein the PMOS transistors of the first and second stacks are formed in the first OD region, and the NMOS transistors of the first and second stacks are formed in the second OD region.

* * * * *